United States Patent [19]

Culp

[11] Patent Number: 5,268,611
[45] Date of Patent: Dec. 7, 1993

[54] ANISOTROPIC TRANSDUCER

[75] Inventor: Gordon W. Culp, Van Nuys, Calif.

[73] Assignee: Rockwell International Corporation, Seal Beach, Calif.

[21] Appl. No.: 851,706

[22] Filed: Mar. 16, 1992

[51] Int. Cl.⁵ .......................................... H01L 41/08
[52] U.S. Cl. ................................... 310/328; 310/366
[58] Field of Search ................ 310/328, 366, 357, 358

[56] References Cited

U.S. PATENT DOCUMENTS

| 3,117,189 | 1/1964 | Kopp | 310/366 |
|---|---|---|---|
| 3,258,617 | 6/1966 | Hart | 310/366 |
| 3,381,149 | 4/1968 | Wiggins et al. | 310/366 |
| 3,462,746 | 8/1969 | Bartlett | 310/358 |
| 3,489,931 | 1/1970 | Teaford | 310/328 |
| 4,140,936 | 2/1979 | Bullock | 310/328 |
| 4,431,935 | 2/1984 | Rider | 310/331 |
| 4,775,815 | 10/1988 | Heinz | 310/328 |
| 4,812,698 | 3/1989 | Chida et al. | 310/366 |
| 4,928,030 | 5/1990 | Culp | 310/328 |
| 5,017,820 | 5/1991 | Culp | 310/328 |
| 5,027,028 | 6/1991 | Skipper | 310/328 |
| 5,043,621 | 8/1991 | Culp | 310/328 |
| 5,068,566 | 11/1991 | Culp | 310/328 |
| 5,095,725 | 5/1992 | Wada et al. | 310/328 |
| 5,170,089 | 12/1992 | Fulton | 310/328 |

FOREIGN PATENT DOCUMENTS

0148389  8/1985  Japan ................................. 310/328

Primary Examiner—Mark O. Budd
Assistant Examiner—Thomas M. Dougherty
Attorney, Agent, or Firm—H. Fredrick Hamann; Harry B. Field; Steven E. Kahm

[57] ABSTRACT

This invention relates to an actuator which changes its length without changing its width or breadth dimensions. Four shear electrodeformable bodies 4 are placed symmetrically on two faces of a central electrode 6. Each body also has a connecting electrode 8, attached to the electrodeformable body, thus forming a tetramorph which is the basic building block of the actuator. Each connecting electrode allows the tetramorphs to be attached to each other in layers and stacks to the desired dimensions of the actuator. Two of the electrodeformable bodies in the top half of the tetramorph are polarized to shear in one direction and the two electrodeformable bodies in the bottom half are polarized to shear in the opposite direction. If the shear in the electrodeformable bodies is up and down the tetramorph acts as a lifter. If the shear in the electrodeformable bodies is sideways the tetramorph is a tangenter or axier.

13 Claims, 3 Drawing Sheets

ANISOTROPIC TRANSDUCER

BACKGROUND OF THE INVENTION

1. Field of the Invention

The present invention relates to electrical transducers and, in particular, to an actuator that forcefully positions in a translatory direction perpendicular to the broad plane of the actuator.

2. Description of the Related Art

A diverse class of known actuators, comprising integral piezoelectric body portions that forcefully position an object in two or more directions, use the thickness or extension piezoelectric mode in at least one said portion. When thickness or extension actuator portions are affixed to a rigid structural member, a significant fraction of the mechanical stroke and available force is relegated to the generation of internal strain because thickness and extension deformations are inseparable. The extending (actually contracting) portion is under tension, a strain less well accommodated by brittle ceramic materials. Internal strain hastens dissolution of a highly stressed actuator. Thickness and extension deformations, being inseparable, cause one motion to influence the other. No known form of ferroelectric actuator using an electric field parallel to the polarization direction is capable of producing a pure translation throughout the actuator body.

A thickness or extension mode piezoelectric element is generally polarized by applying an electric field across its layer thickness (shortest distance). Later, the application of an operating electric field in the same direction as the original polarizing field results in the thickness or extension deformation. Large fields are required to generate desirably large deformations. Thickness and extension actuators are generally restricted to monopolar electric drive. If an intense electric field is applied in a direction antiparallel to the direction of original polarization, the polarization is reduced, destroyed, and in severe cases, reversed to varying degrees. The latter is unacceptable in all applications wherein the sense of action must be preserved relative to the polarity of the applied electric potential. It is highly desirable for the piezoelectric actuator to accommodate bipolar electric drive. Electric and electromechanical resonance is characterized by symmetric sinusoidal voltage swings. Common thickness and extension piezoelectric elements accept bipolar drive when the potential-supplying apparatus is elevated toward one polarity with a potential high enough to avoid depolarization. The value of potential commonly used is half the maximum peak-to-peak swing. Elevated potential, also called floating, power supplies require more robust insulation, and leave some circuit portions at high potential, a hazard. Circuits using the capacitance of the piezoelectric element as a portion of a floating free-running resonator are therefore more difficult to design and construct. Rectification of an otherwise polarity-symmetric drive leaves the actuator undriven during each "wrong" half cycle.

Monopolar electric drive causes a predetermined piezomechanical stroke associated with a particular applied electric field. When the actuator accepts the opposite polarity of electric field without depolarizing, the actuator may provide another increment of stroke of equal magnitude but opposite direction. Therefore, bipolar drive effectively doubles the available mechanical stroke without raising either the applied electric field intensity or the state of maximum strain.

An advantage of the thickness mode actuator is the ability to apply relatively large forces in the stroke direction. This direction is normal to the broad surfaces of the sheets of piezoelectric materials generally used. Normal force places the piezoelectric layers under compression, a force particularly easily accommodated by brittle piezoelectric ceramics.

A diverse class of actuators, particularly those executing smooth traction walking, benefit from non-sinusoidal mechanical strokes. Non-sinusoidal strokes preclude the direct application of sinusoidal resonant electric drive. Slowly varying direct current electrical sources, such as programmable DC power supplies, for example, have been used to control piezoelectric positioners. These power sources emulate class A amplifiers but have a restricted frequency response. Piezoelectric actuators are almost completely capacitively reactive. All the reactive capacitive current flows through the amplifier output devices. A class A amplifier dissipates all of the available power internally under null excitation, a detriment to electromechanical efficiency. The variable DC voltage is essentially free of superimposed high frequency ripple, and it provides smooth control and piezoelectric positioning at slow speed (including zero speed) with relatively good positioning accuracy. At modest frequencies and voltages, programmable DC power supplies operate piezoelectric actuators as smooth walking actuators without losses from sliding friction. However, high efficiency is beyond the capability of a programmable DC power supply emulating a class A or class B amplifier. Operation becomes more difficult and less efficient above a few walking cycles per second or with voltages above about 200 volts. Furthermore, none of the known class A or class B linear amplifiers remain stable when driving an entirely capacitive load. Therefore, they are not applicable to electromechanically efficient piezoelectric walking actuators except at the lowest portion of the amplifier's frequency band.

A electronic drive described in U.S. Pat. No. 4,628,275 issued to Skipper, et al. emulates a class A amplifier. The amplifier provides the high bipolar voltage swings necessary to operate piezoelectric shear actuators. However, the ultrasonic charge transfer cycles of the amplifier, even when holding a steady voltage, accelerate the rate of wear and fatigue in all mechanisms connecting the actuator to positioned objects. Furthermore, the amplifier requires high voltage DC power supplies, large and heavy transformers, and very fast switching devices to achieve modest electrical efficiencies. The use of AC-to-DC power converters and the presence of large reactive currents in output switching devices precludes efficiencies above about 60%.

Piezoelectric actuators capable of smooth walking are inherently well suited to operation in a vacuum, such as in orbiting space stations, because lubrication is not required. The high mechanical efficiency of piezoelectric actuators also avoids excessive heating during operation, thus eliminating the need for ancillary cooling that reduces overall system efficiency. Furthermore, piezoelectric actuators require no additional energy from the power source to maintain a stationary force.

Operation in a vacuum imposes similar thermal management requirements on the drive electronics. The need for heat removal decreases dramatically with increasing efficiency. Internal heat generation by an ideal electrical power source is negligible when piezoelectric actuators apply a stationary force or operate at low velocities. Ideally, the energy supplied by the drive system should equal the energy converted to useful mechanical work by the actuators. The walking actuator provides a normal force necessary for frictional traction or the engagement of teeth before application of a tangential force by another actuator body portion. Because resonance and bipolar drive offer relatively high efficiency, there is a need for a lifting body portion with these qualities.

SUMMARY OF THE INVENTION

A lifting portion of a compound, or multi-axis actuator employs shearing layers in which structural and operating forces are borne by the electrodes of the actuator body portion. Forces are generated and borne by shear. Absence of thickness and extension deformations precludes internal conflicting stresses and allows all actuator portions to provide full forceful bidirectional stroke. Shear segmentation and an alternating electrode arrangement provide stroke length multiplication without increasing operating voltage. The electrode arrangement also provides independent electrical layer activation that advantageously accommodates non-sinusoidal resonant operation that enhances mechanical as well as electrical efficiency of actuator operation, particularly during smooth walking by the compound actuator of which the lifting actuator is a component.

OBJECTS OF THE INVENTION

One object of the invention is to provide an actuator which maintains its dimensions in two directions while extending in a third direction.

Another object of the invention is to provide an actuator which avoids internal stresses.

A further object of the invention is to eliminated bonding stresses and loss of stroke in the actuator due to stress.

Another object of the invention is to provide an actuator with improved stiffness.

Other objects, advantages and novel features of the present invention will become apparent from the following detailed description of the invention when considered in conjunction with the accompanying drawings.

BRIEF DESCRIPTION OF THE DRAWINGS

For a more complete understanding of the present invention and for further advantages thereof, the following Description of the Preferred Embodiment makes reference to the accompanying Drawings, in which:

FIG. 10 is a perspective view of the presently preferred method of making the actuator body of FIG. 6a.

DETAILED DESCRIPTION OF THE INVENTION

The present invention comprises an actuator that employs shearing portions, comprising piezoelectric elements, and shear-translated structural extensions, attached to the piezoelectric elements to provide forceful positioning in a direction perpendicular to the broad plane of the apparatus. Although couched in terms of piezoelectric shear actuator layers, the actuator of the present invention may incorporate any combination of known transducer media that produces forceful shear in response to electrical stimulation.

Figures 1, 2:
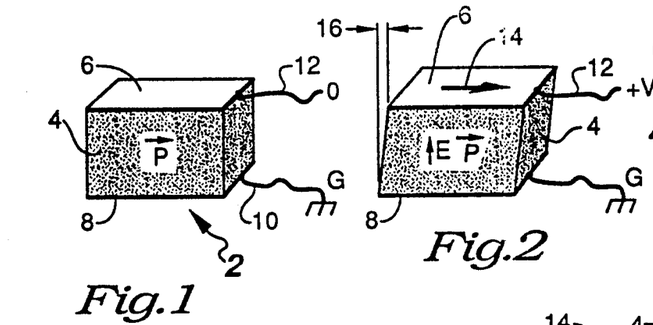
FIG. 1 is a perspective view of a quiescent piezoelectric shear element.
FIG. 2 is a perspective view of the element of FIG. 1 with a positive applied electrical potential.
Figure 3:
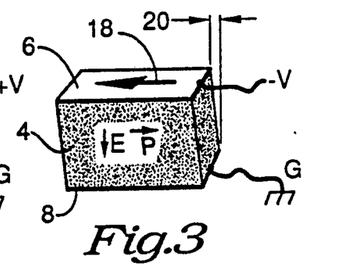
FIG. 3 is a perspective view of the element of FIG. 1 with a negative applied electrical potential.

For a clear understanding of the present invention, FIGS. 1-3 provide an introduction to piezoelectric shear actuator elements. FIG. 1 shows a piezoelectric element 2, comprising piezoelectric body 4, top active film electrode 6, bottom stationary film electrode 8, and leads 10 and 12 to connect the electrodes to a source of electrical potential. For simplicity, stationary electrode 8 is assumed to remain fixed in space and at electrical ground. Piezoelectric body 4, when such body is made of ferroelectric material, is polarized in the direction indicated by the arrow labeled P. The piezoelectric element of FIG. 1 has no potential applied to lead 12 and stands in its true electrical and mechanical zero state.

FIG. 2 shows the piezoelectric element of FIG. 1 after the application of a positive electric potential +V to lead 12. The electrical potential +V causes an electric field in direction E in body 4. The applied electric field in combination with polarization P causes body 4 to shear elastically. The shear deformation results in translation of electrode 6 in direction 14 by mechanical stroke 16 relative to fixed electrode 8. The magnitude of stroke 16 is governed by the piezoelectric shear constant of the material of body 4 and the intensity of the electric field, E. FIG. 3 shows that the magnitude of the mechanical stroke 20 is in the opposite direction 18, when the opposite polarity of the potential applied to lead 12 is −V.

In piezoelectric elements it is important to apply the electric field perpendicular to the direction of polarization because if the electric field is applied antiparallel to the polarization direction reduction, destruction, and in severe cases, reversal of polarization occurs. In addition, both the coupling coefficient and the piezoelectric coefficient of action of shear elements are generally larger than those of similarly sized thickness and extension elements.

Figure 4:
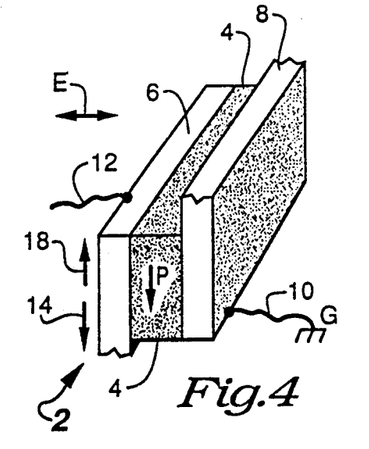
FIG. 4 is a perspective view of the element of FIG. 1 having load-bearing electrodes.

FIG. 4 is a perspective view of a single piezoelectric shear body 4 affixed between ground electrode 8 and active electrode 6, body 4 being polarized in direction P. The application of a bipolar electric signal to lead 12 causes shear deformation of body 4 that translates electrode 6 in direction 14 or 18 relative to electrode 8, depending on the polarity applied. The translation is essentially free of internal tensile stress because each plane of body 4 parallel to electrodes 6 and 8 does not change size during the shear deformation. Therefore, there is no internal stress between body 4 and its affixing electrodes.

Electrodes 6, 8 extend beyond body 4 in order to carry loads. During forceful relative electrode translation, the connecting electrodes carry the shearing forces generated by body 4, and the reaction loads due to forceful positioning of an object. For clarity, the thicknesses of all members of the figure are exaggerated. In practice, both body 4 and connecting electrodes 6, 8, are slender, allowing electrode forces, vertical in the figure, to be borne by body 4 in essentially pure shear. However, the configuration of FIG. 4 cannot, as it stands, stably sustain vertical forces without incurring some bending forces in the piezoelectric body and its electrodes, such forces being less well borne by brittle materials of which piezoelectric elements are an example. The shear force bearing capacity of body 4 is proportional to the area of the broad surface of the body. The stroke in directions 14, 18 are prescribed by the applied electric field intensity in direction E and the piezoelectric sensitivity of body 4. Another similar body affixed to and extending upward from electrode 8 will be urged in directions 14 or 18, thereby adding the strokes of the two bodies. Therefore, a multiplicity of bodies added vertically may be connected in electrical parallel and mechanical series.

Figure 5:
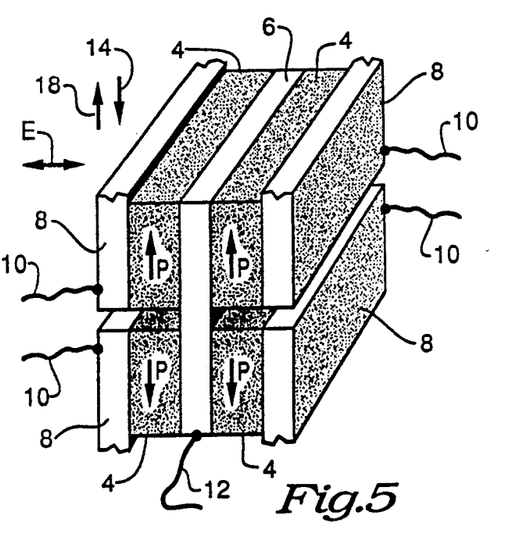
FIG. 5 is a perspective view of a symmetric, balanced-load combination of four elements of FIG. 4.

FIG. 5 is a partial perspective view of a unit cell called a tetramorph, comprising four shear electrodeformable bodies 4 of FIG. 4, central electrode 6, connected to a bipolar electric source by lead 12, and connecting electrodes, 8 connected to electrical ground by leads 10. Tetramorphs can be continuously assembled to the left and right of the one shown, constituting a layer. Tetramorphs can also be continuously assembled vertically, constituting a stroke multiplier. Continuous assembly of tetramorphs is structurally more efficient when common adjacent electrodes are integral. The tetramorph is symmetric with regard to polarization direction and force bearing. As in FIG. 4, the element thickness is greatly exaggerated for clarity.

Unlike the element of FIG. 4, the forces due to normal loads in directions 14, 18 that cause bending of either piezoelectric body 4 or electrodes 6, 8 are made largely self-cancelling by symmetry.

Active electrode 6 is activated by a bipolar electric signal applied by lead 12, resulting in the generation of electric fields in directions E in bodies 4. The electric fields cause connecting electrodes 8 to translate in direction 14 in the lower pair of elements, and in direction 18 in the upper pair of elements, relative to central electrodes 6. The stroke of the tetramorph is thus twice that of the element of FIG. 4 because upper and lower element pairs are in mechanical series. Structurally, the two pairs of bodies 4 are in 2×2 parallel-series and are as stiff as a single element of FIG. 4, neglecting the generally negligible compliances of the electrodes. The tetramorph shown will add its mechanical stroke to the sum of the strokes of all other tetramorphs affixed (vertically in the figure) to the extremities of the one shown.

Figure 6A:
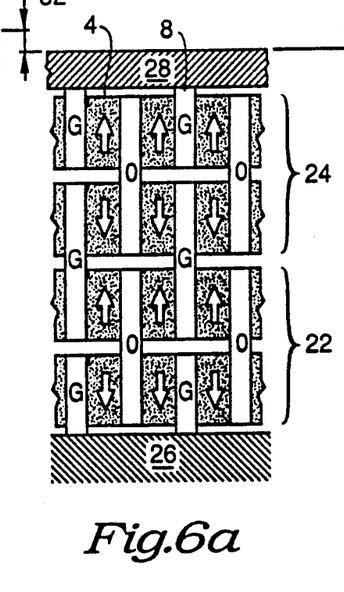
FIG. 6a is a portion cross section view of a quiescent lifting actuator comprised of the elements of FIG. 5.

FIG. 6a shows a partial cross section of the quiescent state of a tetramorph actuator comprising two layers 22, 24 of tetramorphs of FIG. 5, stationary base 26, and movable plane 28. Layers are attached to each other by extensions of electrodes 6 or 8 from one layer to the bodies 4 of adjacent layers. Connection leads are omitted for clarity, but all ground electrodes G may be connected to a common ground, and the active electrodes 0, illustrated at zero potential may be connected to a common bipolar electric source. Alternatively, the active electrodes of each layer, 22 or 24, may be independently electrically activated by a separate electrical source.

Figure 6B:
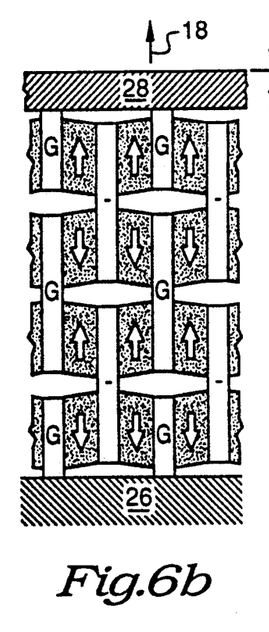
FIG. 6b is a view of the apparatus of FIG. 6a after the application of a negative electric potential.

FIG. 6b shows the actuator of FIG. 6a after the application of a negative potential to active electrodes, now labeled −, resulting in translation of movable plane 28 in direction 18 by forceful mechanical stroke 32 relative to (stationary) base 26.

Figure 6C:
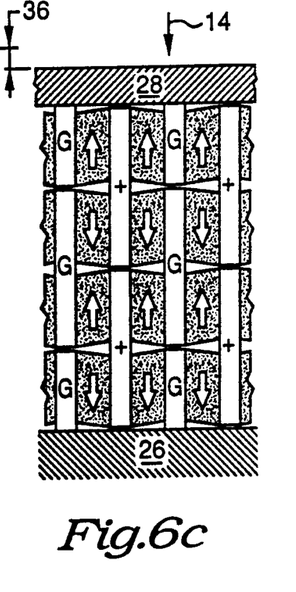
FIG. 6c is a view of the apparatus of FIG. 6a after the application of a positive electric potential.

FIG. 6c shows the actuator of FIG. 6a after the application of a positive potential to active electrodes, now labeled +, resulting in translation of movable plane 28 in direction 14 by forceful mechanical stroke 36.

Adding more tetramorphs, horizontally and into the plane of the figure will increase the area of the layer, thereby increasing the actuating force and normal load carrying capacity of the actuator. In the case of essentially identical piezoelectric bodies 4, and the application of the same electric potential to all the active electrodes, each layer 22 and 24 will produce the same contribution to the total mechanical stroke.

Increasing the number of layers increases the mechanical stroke, and increases the capacitance, and reduces the structural rigidity of the actuator unless compensated for by increasing layer area, but does not increase the operating peak potential (all active electrodes paralleled).

External static forcing means (omitted for clarity) applied to the external vertical side surfaces of the actuator further increase the load bearing capacity of the actuator by compressively overwhelming any internal tendency of shear loads to reorient to bending loads. A static vertical downward force on the body of the tetramorph actuator is allowed but is not essential because load bearing internal to the actuator body is essentially altogether shear, precluding the application of tensile loads to the piezoelectric bodies 4.

Those ground electrodes 8 at the actuator body surfaces proximate stationary base 26 and movable plane 28 are extended to transmit acting loads without causing interference with translations of bodies 4. The extensions also obviate the need for insulators for active electrodes and high-potential portions of piezoelectric bodies 4. Gaps internal to the structure prevent contact of active electrodes of adjacent layers, allowing independent electrical activation of layers. Extending only ground electrodes allows assembly of the lifting actuator assembly to other structural and transducer body portions without regard to the electrical states thereof.

As previously described, the thickness of piezoelectric bodies, electrodes, and gaps are greatly exaggerated in the figures for clarity, and in practice are made small to obtain essentially pure shear load bearing, to achieve a desirably high electric field intensity with the application of a predetermined electric potential, and to allow individual layer activation while preserving actuator body rigidity and load carrying capacity by maintaining an actuator body density close to that of an otherwise solid structure.

Figure 7:
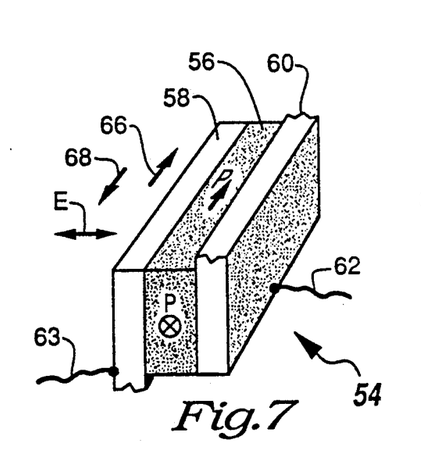
FIG. 7 is a perspective view of a quiescent piezoelectric shear element having load-bearing electrodes similar in construction to the element of FIG. 4 but with shear polarization directed by the arrow P. which is perpendicular to the polarization of FIG. 4.

Referring to FIG. 7, shown is a piezoelectric element 54 similar in construction to the piezoelectric element 2 of FIG. 4 but with shear polarization directed by the arrow P. Piezoelectric body 56 lies between electrodes 58 and 60 to which respective electric potentials are applied by means of leads 64 and 62. When a cyclic bipolar electric potential is applied to lead 62 relative to lead 64, an oscillating electric field is created in directions E in piezoelectric body 56, resulting in relative shear translation between electrodes 58 and 60 indicated by arrows 66, 68. The directions of translation 66, 68 may be perpendicular to the translation directions 16, 18 of the piezoelectric element 2 shown in FIG. 4.

Figure 8:
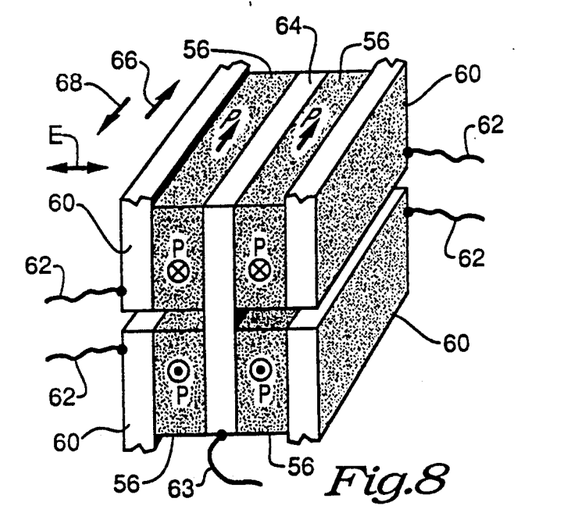
FIG. 8 is a perspective view of a symmetric, balanced-load combination of four elements of FIG. 7.

FIG. 8 is a unit action cell of the preferred embodiment of the present invention called a tetramorph, comprising four piezoelectric shear elements 56 affixed to a common electrode 64 and electrically enclosed in electrodes 60. All electrodes 60 may be electrically connected together and to ground, but not mechanically connected, allowing further ramification by additional tetramorphs without regard to the electrical states of their outer electrodes. The upper pair of elements are polarized into the plane of the figure while the lower pair are polarized in the opposite direction. The upper and lower pairs of elements are arranged in mechanical series by the interdigitated arrangement of the electrodes. A potential applied to lead 63 causes the upper electrode pair to translate relative to the lower electrode pair by a distance equal to the sum of the upper and lower translations, thereby doubling the mechanical stroke compared to the stroke of a single element of FIG. 7. Extensions into and out of the tetramorph pass positioning forces to and from adjoining tetramorphs. Vertical levels of piezoelectric elements are arranged in electrical parallel and mechanical series. Tetramorphs are integrally extended horizontally in the figure to form larger layers capable of greater force. Additional layers are integrally extended vertically in the figure to increase stroke. Parallel electrical connection of one or more tetramorphs into layers activates the layer with a single desirably low potential. Mechanical series connection of layers provides a desirably large mechanical stroke at a given potential. Each layer may be electrically connected to a separate source of electrical potential.

Figures 9A, 9C:
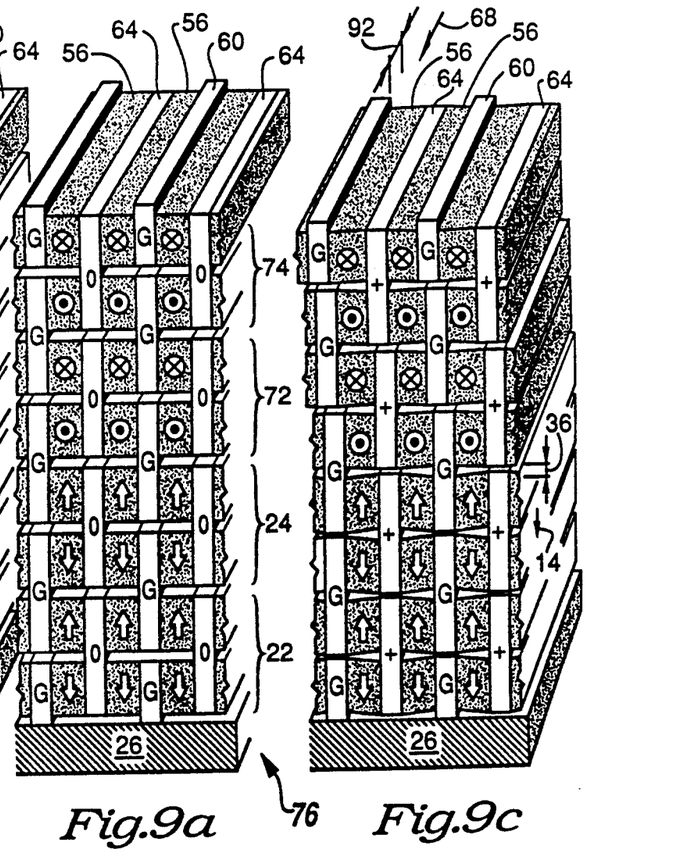
FIG. 9a is a portion cross section view of a quiescent lifting actuator comprised of the elements of FIG. 5 and FIG. 8.
FIG. 9c is a portion cross section view of the apparatus of FIG. 9a after the application of a positive electric potential.

FIG. 9a shows generally as 76 a perspective view of the quiescent state of a portion of a piezoelectric actuator comprising, for example, four layers 22, 24, 72, and 74 tetramorphs. Component labels are carried over from previous figures. Stack tops 28 are omitted for clarity. Layers 22, 24 are composed of tetramorphs of FIG., 5, while layers 72, 74 comprise the tetramorphs of FIG., 8. The stack of layers is affixed to stationary base 26. All active electrodes are electrically connected (wiring omitted for clarity) to a source of electric potential which, when negative, causes the top of the stack to translate in two orthogonal directions simultaneously, the translation having a vertical component of length 32 in direction 18 due to the combined actions of layers 22, 24, and a horizontal component of length 84 in direction 66 into the plane of FIG. 9b due to the combined actions of layers 72 and 74. When the applied electric potential is positive, the stack top translates by distance 36 in direction 14 in combination with distance 92 in direction 68, directions opposite those obtained by a negative applied potential as shown in FIG. 9c.

Figure 9B:
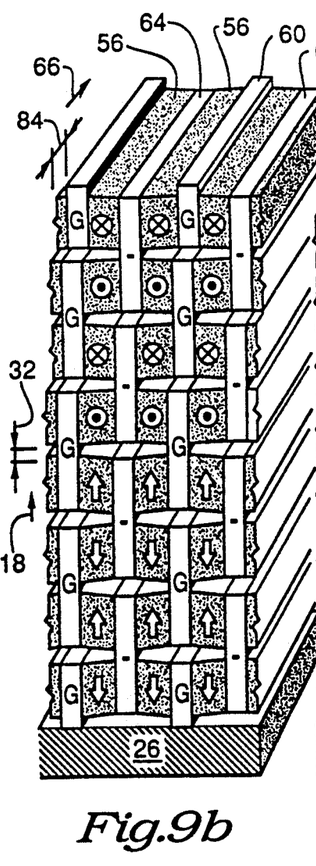
FIG. 9b is a portion cross section view of the apparatus of FIG. 9a after the application of a negative electric potential.

Although individual tetramorphs are independently electrically addressable, the result of differing potentials on portions of adjacent tetramorphs results in undesirable internal stresses. Each layer is therefore electrically connected together and provided with a single respective electric potential. In FIG. 9, layers 22, 24 may be electrically activated with a separate electrical source, while other sources may independently activate layers 72, 74.

An application for the present invention is smooth walking using a pair of the actuators of FIG. 9 activated alternately and cyclically with predetermined electrical wave forms that cause stack tops to smoothly walk without rubbing a traction surface portion of a positioned object. The preferred method of affecting smooth walking in the multilayered embodiment of the present invention is Fourier stimulation as previously described, wherein separate non-sinusoidal mechanical stroke waveforms are stimulated in the actuator portions having angularly disposed directions of action. It should be clear that horizontally and vertically acting layers of tetramorphs may be located in any desired order in the stack without changing the action of the actuator output.

Although rectilinear actions of tetramorphs have been described, it is emphasized that the directions of polarizations P determine the directions of the mobile electrodes. Polarizations may be aligned 45 degrees to the layer plane for example, providing a 45 degree tetramorph direction of action.

However, a diverse class of applications of walking actuators may engender greater accelerations in the vertical, or stepping-down, direction than in the horizontal, or tread direction. Therefore, for such applications, the preferred location of step-down layers is near the actuator output end where the least mass must be accelerated. For a description of smooth walking actuators see Applicant's patent, U.S. Pat. No. 5,043,621 issued Aug. 27, 1991 entitled Piezoelectric Actuator, which is hereby made a part hereof and incorporated herein by reference.

A third direction of actuator action is added by affixing anywhere in the illustrated stack a shear actuator of the piezoelectric shear type described in U.S. Pat. No. 4,928,030 issued May 22, 1990 entitled Piezoelectric Actuator which is hereby made a part hereof and incorporated herein by reference. Other layers such as twisters may be added to give the stack nonlinear motions from one or more layers. Twisters are described in the Applicant's copending application Ser. No. 07/708,643 filed May 31, 1991 entitled Twisting Actuators, which is hereby made a part hereof and incorporated herein by reference.

The preferred methods of making actuators with two or more directions of motion are extensions of the methods previously described for making single-direction actuators, in combination with the step of orienting the direction of action of each plane of actuator elements in a predetermined manner.

The primary advantage of the multiple-axis embodiment of the present invention is avoidance of internal stresses. Shear deformation, particularly the deformations of piezoelectric elements, entail a two-dimensional deformation that keeps the volume of the element essentially constant, translates one plane (electrode) relative to another, but causes essentially no change in the thickness, width or length of the element. During actuator operation no internal strains other than the shear strain applied to the positioned object are generated between elements, between tetramorphs, between layers of the same action direction, and between adjacent layers acting in angularly disposed directions. Further, unlike the inseparable thickness-extension deformations of prior art piezoelectric elements that suffer a stroke loss when one of the deformations is constrained by bonding the element to a rigid support, the shear element bonding surfaces do not change shape during shear deformation and therefore do not restrict full and unencumbered actuation.

Another advantage to the multiple-axis embodiment of the present invention is monolithic construction having components of similar size and shape with similar orientations, allowing convenient and economical actuator manufacturing with a single and relatively simple apparatus.

Figure 10:
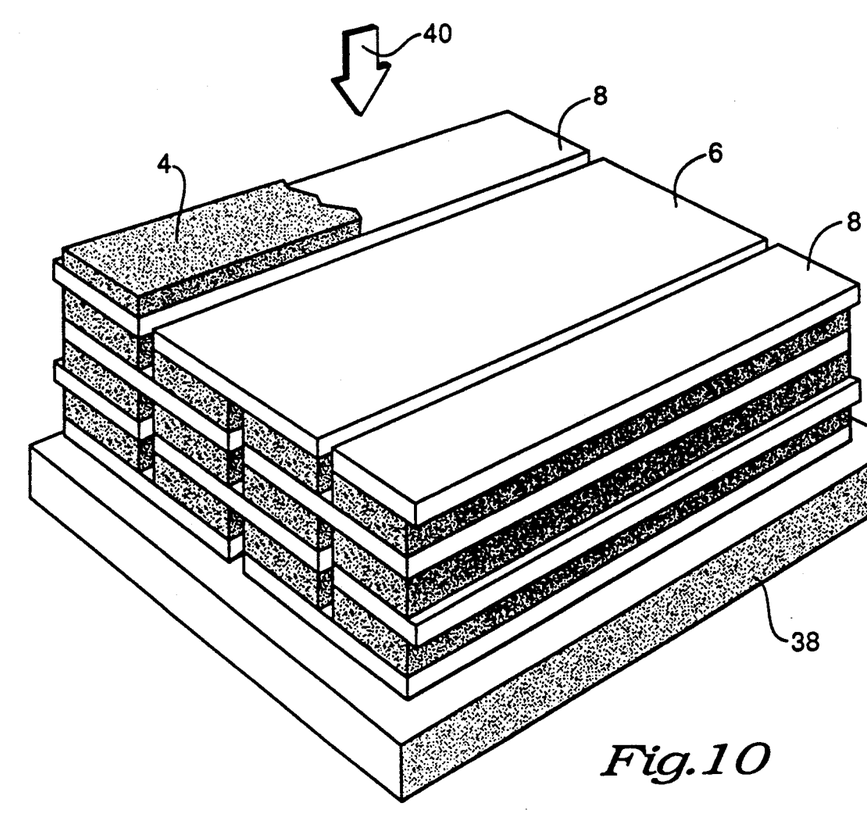

FIG. 10 is a perspective view of a partially completed tetramorph actuator body under construction by a manufacturing method comprising the steps of successive epitaxial application of layers of piezoelectric 4 and electrode 6, 8 materials onto a temporary substrate 38 from material source direction 40. Source direction 40 includes directions other than purely normal to the broad deposited surfaces during some steps of the method, to enhance the directionality of piezoelectric materials deposition, for example. This method is preferred for relatively thin layers of small actuators and thin layers of large, high performance actuators. Masks (omitted) confine the depositions to predetermined patterns. Temporary filler materials can be deposited where gaps are required, the fillers removed after body completion by evaporation, melting, or solvation. Compressible, electrically insulating fillers are left in place in actuators that operate in vacuum or other hostile environments. Compressible insulating gap fillers allow operation, for example, at pressures within the range of gas pressures that allow electrical conduction.

Temporary substrate 38 is removed after completion of the actuator body, thereby permitting rotation by a quarter turn (of the figured body) and subsequent assembly to the other actuator parts such as other layers. A subset of actuator lifting layers may be deposited and tested as separate components and subsequently assembled into a larger lifting actuator. Inter-electrode wiring, connections to external electrical terminals, and electric drive components can be co-deposited with the electrodes and piezoelectric bodies. Piezoelectric bodies can be deposited from materials that are intrinsically piezoelectric (rather than ferroelectric) and are inherently polarized in the directions illustrated by a deposition process which is well known to those versed in the art. Ferroelectric materials may be polarized by the polarizing step of deposition of each piezoelectric body. Electric drive components may be co-deposited on layers of insulation that are thinner than the piezoelectric body thickness. Co-deposited drive components (omitted from the figures) are also deposited on polarized or unpolarized portions of the piezoelectric bodies, resulting in higher inherent reliability, simpler integration with other actuator segments, and simplified connection to electrical sources and source controlling means. Thinner layers reduce the peak potential needed to achieve a predetermined electric field intensity, while thinner layers, being more numerous, add proportionally to the capacitance of the assembly. Despite the higher capacitance of thinner layers, entailing larger reactive currents during operation, the lower operating potential allows the use of solid state devices of direct-drive electrical sources. Lower potentials also increase actuator reliability by reducing electrical stress on insulating materials adjunct to the acting layers.

FIG. 10 also illustrates a method of assembling large actuators using preformed, prepolarized, pre-electroded piezoelectric bodies, and prefabricated electrodes. Layers of prefabricated components 4, 6, and 8 may be stacked on a temporary substrate 38 with a device (not illustrated) to maintain prescribed gaps between components. The assembly can then be subjected to pressure in direction 40 relative to substrate 38 until all components become integral. The method also includes the coating of each plane surface of each piezoelectric body that is to be proximate an electrode with diffusible, conducting material, for example, gold. The electrode bonding surfaces may be similarly coated. The integration step includes the application of modest pressure 40 and moderate temperature until the conducting coatings inter-diffuse to join piezoelectric elements and electrodes into a monolithic structure. Variants of the method can add the steps of drying, dust removal, and vacuum as aids to inter-diffusion. Inter-electrode electrical connections can be made by extensions (not illustrated) of the electrodes. Alternatively, electrodes can be etched from a broad sheet, each electrode being joined to one or more neighboring electrodes by a permanent or subsequently removed conducting portion of the sheet.

Figure 11:
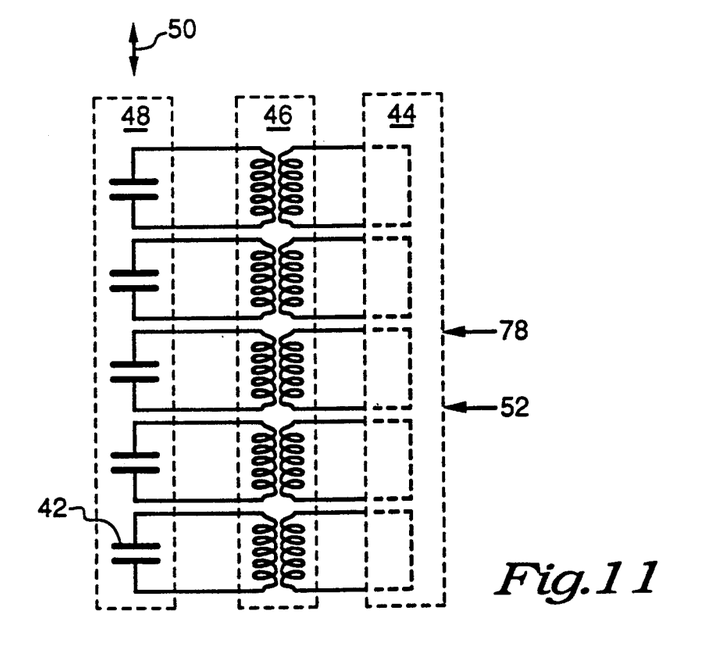
FIG. 11 is a schematic drawing of the control means for the circuit for driving the actuators.

FIG. 11 is an abbreviated schematic of an electrical drive means, comprising electrical source connection 52, actuator activation signal connection 78, controller 44, stimulator 46, and actuator 48 of the present invention. Actuator 48 further comprises actuator layers or groups of electrically paralleled layers, shown schematically as typical layer or layer group capacitances 42. Each layer or layer group is connected in a loop with a portion of stimulator 46. In response to activation signals 78, controller 44 distributes electrical power from input 52 to stimulators 46. Controller 44 creates a time-varying signal for each circuit of stimulator 46 that consists of a unique amplitude, frequency, phase, and polarity. Each stimulator circuit stimulates the corresponding layer-stimulator loop to resonate electrically (but not necessarily mechanically). Amplitudes and frequencies of loop resonances are predetermined by the non-sinusoidal mechanical stroke wave form desired from actuator 48. For example, when the lifting actuator is a portion of a smooth walking actuator, the lifting mechanical wave form is an approximation of a rectangular wave in direction 50. Such wave forms may be obtained by selection of layer or layer group signals in accordance with Fourier's Theorem. High lift, flat-topped portions of the wave form apply the normal force needed for traction by other actuator portions. The low-lift portions of the wave form provide the clearance between retracing traction portions of the actuator as it prepares for the next walking step. The rectangular lifting wave form contributes to the mechanical efficiency of the walking actuator by preventing sliding during every portion of the walking motion. The use of resonance contributes to the electrical efficiency of the system by relegating high voltage swings and large reactive currents to the layer-stimulator loops, rather than through relatively resistive output components of controller 44.

For a more detailed explanation of control circuits, wave forms and driving signals see the Applicant's copending patent applications Ser. No. 07/488,548 filed Mar. 5, 1990 and continued as Ser. No. 07/743,069 on Aug. 9, 1991 entitled Electrical Drive for a Segmented Transducer, also see Applicant's copending application Ser. No. 07/836,495 filed Feb. 18, 1992 entitled Walking Toothed Actuator and U.S. Pat. No. 4,628,275 issued Dec. 9, 1986 entitled Efficient Power Amplifier for high Capacitive Devices, by Skipper et al. all of which are made a part hereof and incorporated herein by reference.

An embodiment of the present invention made of electromechanically reciprocal electroshearable material may be used as a force sensor. In the practice of the invention, piezoelectric elements are relatively numerous, forces are borne by many parallel and series paths, and local stresses are low enough to permit at least one element to be used as a sensor. In the embodiment of the present invention using piezoelectric shear elements, the law of reciprocity allows an element to convert applied electric charge to mechanical work, and conversely, to convert mechanical action to electrical signals. The sensor signal is an analog of the state of force inside the lifting actuator body and is used by controller 44 (connections omitted) to coordinate the timing of signals applied to the actuator's layers or layer groups.

It is to be understood that within the scope of the present invention, lifting actuator elements also include electrostrictive, remanent, permeable, magnetostrictive, thermal-expansive, and other materials that provide a forceful shear translation in response to electrical stimulation as previously described, the piezoelectric shear embodiment being described by way of example.

Obviously, many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. An actuator comprising, a central electrode with a first face and an opposite second face, each face having a top portion and a bottom portion,
   a first shear electrodeformable body having a first broad surface and an opposite second broad surface, wherein the first broad surface is attached to the top portion of the first face of the central electrode,
   a first connecting electrode with a first face and an opposite second face, wherein the first face of the connecting electrode is attached to the second broad surface of the first shear electrodeformable body,
   a second shear electrodeformable body having a first broad surface and an opposite second broad surface, wherein the first broad surface is attached to the top portion of the second face of the central electrode,
   a second connecting electrode with a first face and an opposite second face, wherein the first face of the connecting electrode is attached to the second broad surface of the second shear electrodeformable body,
   a third shear electrodeformable body having a first broad surface and an opposite second broad surface, wherein the first broad surface is attached to the bottom portion of the first face of the central electrode,
   a third connecting electrode with a first face and an opposite second face, wherein the first face of the connecting electrode is attached to the second broad surface of the third shear electrodeformable body,
   a fourth shear electrodeformable body having a first broad surface and an opposite second broad surface, wherein the first broad surface is attached to the bottom portion of the second face of the central electrode,
   a fourth connecting electrode with a first face and an opposite second face, wherein the first face of the connecting electrode is attached to the second broad surface of the fourth shear electrodeformable body,
   wherein the broad surfaces of the shear electrodeformable bodies do not change size when the shear electrodeformable bodies are activated.

2. An actuator as in claim 1 wherein the first and second shear electrodeformable bodies are polarized to shear in one direction and the third and fourth shear electrodeformable bodies are polarized to shear in the opposite direction when the actuator is activated.

3. An actuator as in claim 2 wherein the shear electrodeformable bodies shear left and right with respect to the top and bottom of the central electrode.

4. An actuator as in claim 2 wherein the shear electrodeformable bodies shear up and down with respect to the top and bottom of the central electrode.

5. An actuator as in claim 3 wherein a plurality of actuators are attached by a common connecting electrode having a first face attached to a shear electrodeformable body of a first actuator and a second opposing face attached to a shear electrodeformable body of an adjacent actuator to form an actuator layer.

6. An actuator as in claim 5 wherein the first connecting electrode of one actuator is connected on one face to the second shear electrodeformable body of the adjacent actuator and the third connecting electrode of one actuator is connected on one face to the fourth electrodeformable body of the adjacent actuator.

7. An actuator as in claim 3 wherein the connecting electrodes have a top portion and a bottom portion and wherein the bottom portion of the first connecting electrode is attached to the first electroshearable body of one actuator and the top portion is attached to the third electroshearable body of an adjacent actuator and wherein the bottom portion of the second connecting electrode is attached to the second electroshearable body of one actuator and the top portion is attached to forth electroshearable body of an adjacent actuator thus forming an actuator stack.

8. An actuator as in claim 4 wherein a plurality of actuators are attached by a common connecting electrode having a first face attached to the shear electrodeformable body of a first actuator and a second opposing face attached to the shear electrodeformable body of an adjacent actuator to form an actuator layer.

9. An actuator as in claim 8 wherein the first connecting electrode of one actuator is connected on one face to the second shear electrodeformable body of the adjacent actuator and the third connecting electrode of one actuator is connected on one face to the fourth electrodeformable body of the adjacent actuator.

10. An actuator as in claim 4 wherein the connecting electrodes have a top portion and a bottom portion and wherein the bottom portion of the first connecting electrode is attached to the first electroshearable body of one actuator and the top portion is attached to third electroshearable body of an adjacent actuator and wherein the bottom portion of the second connecting electrode is attached to the second electroshearable body of one actuator and the top portion is attached to forth electroshearable body of an adjacent actuator thus forming an actuator stack.

11. An actuator of claim 9 wherein the connecting electrodes have a top portion and a bottom portion and wherein the bottom portion of the first connecting electrode is attached to the first electroshearable body of one actuator and the top portion is attached to the third electroshearable body of an adjacent actuator and wherein the bottom portion of the second connecting electrode is attached to the second electroshearable body of one actuator and the top portion is attached to the fourth electroshearable body of an adjacent actuator thus forming an actuator stack.

12. An anisotropic transducer comprising a central electrode having a first face and an opposite second face, each face having a top portion and a bottom portion, four electrodeformable bodies symmetrically attached to the central electrode, having two bodies on each face, each electrodeformable body having a connecting electrode attached, wherein the connecting electrodes are attached to electrodeformable bodies of adjacent anisotropic transducers.

13. An anisotropic transducer comprising a central electrode having a first face and an opposite second face, each face having a top portion and a bottom portion, four electrodeformable bodies symmetrically attached to the central electrode, having two bodies on each face, each electrodeformable body having a connecting electrode attached, each electrodeformable body shears in a plane parallel to the central electrode faces when activated, wherein the connecting electrodes are attached to electrodeformable bodies of adjacent anisotropic transducers.

* * * * *